(12) United States Patent
Cho et al.

(10) Patent No.: US 7,317,655 B2
(45) Date of Patent: Jan. 8, 2008

(54) MEMORY CELL ARRAY BIASING METHOD AND A SEMICONDUCTOR MEMORY DEVICE

(75) Inventors: Beak-Hyung Cho, Hwaseong-si (KR); Du-Eung Kim, Yongin-si (KR); Choong-Keun Kwak, Suwon-si (KR); Sang-Beom Kang, Hwaseong-si (KR); Woo-Yeong Cho, Hwaseong-si (KR); Hyung-Rok Oh, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/327,967

(22) Filed: Jan. 9, 2006

(65) Prior Publication Data

US 2006/0164896 A1 Jul. 27, 2006

(30) Foreign Application Priority Data

Jan. 25, 2005 (KR) ............ 10-2005-0006581

(51) Int. Cl.
*G11C 8/00* (2006.01)

(52) U.S. Cl. .............. 365/230.06; 365/230.01

(58) Field of Classification Search ......... 365/230.06, 365/230.01, 163
See application file for complete search history.

(56) References Cited

U.S. PATENT DOCUMENTS

| 4,455,629 | A | * | 6/1984 | Suzuki et al. ......... 365/230.06 |
| 4,598,386 | A | * | 7/1986 | Roesner et al. ............ 365/105 |
| 4,884,238 | A | * | 11/1989 | Lee et al. .................. 365/105 |
| 5,751,651 | A | | 5/1998 | Ooishi |
| 5,818,749 | A | * | 10/1998 | Harshfield ................. 365/105 |
| 6,084,804 | A | * | 7/2000 | McPartland ........... 365/189.11 |
| 6,144,610 | A | | 11/2000 | Zheng et al. |
| 6,337,831 | B1 | * | 1/2002 | Nam .................... 365/230.06 |
| 6,452,858 | B1 | * | 9/2002 | Hanzawa et al. ...... 365/230.06 |
| 6,462,984 | B1 | | 10/2002 | Xu et al. ................... 365/175 |
| 6,618,295 | B2 | | 9/2003 | Scheuerlein .......... 365/189.09 |
| 2003/0123284 | A1 | | 7/2003 | Lowry et al. |
| 2006/0203541 | A1 | * | 9/2006 | Toda ......................... 365/163 |

FOREIGN PATENT DOCUMENTS

| KR | 2003-0059436 | 7/2003 |
| KR | 2003-0070544 | 8/2003 |

OTHER PUBLICATIONS

Toshihiko Hirose, et al: "A 20-ns 4-Mb CMOS SRAM with Hierarchical Word Decoding Architecture" IEEE Journal of Solid-State Circuits, IEEE Service Center, Piscataway, NJ, US, vol. 25, No. 5, (Oct. 1, 1990), pp. 1068-1073.

* cited by examiner

*Primary Examiner*—Vu A. Le
(74) *Attorney, Agent, or Firm*—F. Chau & Assoc., LLC

(57) ABSTRACT

A method of biasing a memory cell array during a data writing operation and a semiconductor memory device are provided. The semiconductor memory device includes: a memory cell array including a plurality of memory cells in which a first terminal of a memory cell is connected to a corresponding first line among a plurality of first lines and a second terminal of a memory cell is connected to a corresponding second line among a plurality of second lines; and a bias circuit for biasing a selected second line to a first voltage and non-selected second lines to a second voltage.

23 Claims, 4 Drawing Sheets

MEMORY CELL ARRAY BIASING METHOD AND A SEMICONDUCTOR MEMORY DEVICE

CROSS-REFERENCE TO RELATED APPLICATION

This application claims priority to Korean Patent Application No. 10-2005-0006581, filed on Jan. 25, 2005, in the Korean Intellectual Property Office, the disclosure of which is incorporated by reference herein in its entirety.

BACKGROUND OF THE INVENTION

1. Technical Field

The present invention relates to a semiconductor memory device, and more particularly, to a semiconductor memory device and a data writing method for controlling a biasing level of a memory cell array.

2. Discussion of the Related Art

Phase change random access memories (PRAMs) are nonvolatile memory devices which store data using a phase change material, e.g., Ge—Sb—Te (GST), whose resistance changes in accordance with a phase transition due to a change in temperature.

FIG. 1 illustrates an equivalent circuit of a unit cell C of a PRAM. Referring to FIG. 1, the unit cell C consists of a P—N diode D and a phase change material GST. The phase change material GST is connected to a bit line BL and a P-junction of the diode D. A word line WL is connected to an N-junction of the diode D.

The phase change material GST of the PRAM unit cell C, goes into a crystalline state or an amorphous state depending on a temperature applied thereto and a heating time. This enables data to be stored in the PRAM cell. In general, a temperature higher than 900° C. is needed for a phase transition of the phase change material GST. Such temperatures are obtained by Joule heating which uses a current flowing through the PRAM cell to increase or decrease the temperature thereof.

A write operation for the phase change material GST will now be described. First, the phase change material GST is heated above its melting temperature by a current and then it is rapidly cooled. The phase change material GST then goes into the amorphous state and stores a data "1". This state is referred to as a reset state. The phase change material GST is then heated above its crystallization temperature for a predetermined period of time and cooled. Next, the phase change material GST goes into the crystalline state and stores a data "0". This state is referred to as a set state.

A read operation for the phase change material GST will now be described. After a bit line and a word line are used to select a memory cell, an external current is provided to the selected memory cell. It is then determined whether data to be stored in the selected memory cell is "1" or "0" based on a change in voltage according to a resistance value of the phase change material GST of the selected memory cell.

FIG. 2 illustrates a semiconductor memory device 200 comprising a memory cell array MAY including a plurality of the PRAM unit cells C shown in FIG. 1. An exemplary structure of the memory cell array MAY is disclosed in U.S. Pat. Nos. 6,667,900 and 6,567,296.

Referring to FIG. 2, the semiconductor memory device 200 comprises the memory cell array MAY and a word line driver 210. The memory cell array MAY comprises a plurality of unit cells C connected to corresponding bit lines BL0~BLk-1 and word lines WL0, WL1, and WL2. Although only k bit lines BL0~BLk-1 and three word lines WL0, WL1, and WL2 are shown in FIG. 2, the number of bit lines and word lines is not limited thereto.

For a data write operation, if one of the bit lines BL0~BLk-1 is first selected, the word line driver 210 selects one of the word lines WL0, WL1, and WL2. The selected word line is then set to a low level. If a first bit line BL0 and a first word line WL0 are sequentially selected, a write current applied to the first bit line BL0 flows through a unit cell connected between the first bit line BL0 and the first word line WL0. The state of the phase change material of the unit cell is then changed to store data.

Each of the word lines WL0, WL1, and WL2 has its own resistance R_WL. Since the word lines WL0, WL1, and WL2 pass current when writing data, the resistance R_WL should be minimized. However, since the word lines WL0, WL1, and WL2 have a high resistance, the number of unit cells connected to the word lines WL0, WL1, and WL2 is limited. Further, the word line driver 210 should be powerful enough to drive the word lines WL0, WL1, and WL2.

When data is written to the unit cell connected between the first bit line BL0 and the first word line WL0, the write current is applied to the first bit line BL0, and the first word line WL0 is set to a low level by the word line driver 210. The second and third word lines WL1 and WL2 are then in a floating state. The first bit line BL0 maintains a relatively high voltage due to the applied write current, and the second and third word lines WL1 and WL2 maintain a relatively low level in the floating state. Therefore, current flows through unit cells connected between the first word line WL0 and the second and third word lines WL1 and WL2, which can change the state of the phase change material in those unit cells.

Since current may flow through unselected word lines that are floating, it is difficult to increase the operating speed of the semiconductor memory device and perform stable sensing. As such, a need exists for a semiconductor memory device that is capable of performing a stable sensing operation while increasing its operating speed.

SUMMARY OF THE INVENTION

A semiconductor memory device and a data writing method are provided that prevent current from flowing from a selected bit line to a non-selected word line by maintaining a constant voltage in the non-selected word line, thereby enabling stable sensing and increasing the operating speed of the semiconductor memory device.

According to an aspect of the present invention, there is provided a semiconductor memory device comprising: a memory cell array including a plurality of memory cells in which a first terminal of a memory cell is connected to a corresponding first line among a plurality of first lines and a second terminal of a memory cell is connected to a corresponding second line among a plurality of second lines; and bias circuits for biasing a selected second line among the second lines to a first voltage and a non-selected second line to a second voltage.

The first voltage may be a ground voltage and the second voltage may be a power voltage. The bias circuits may comprise: NMOS transistors connected between the second lines and the ground voltage; and PMOS transistors connected between the second lines and the power voltage.

Drains of the NMOS transistors may be connected to the second lines, sources are connected to the ground voltage, and main word line signals are applied to gates of the NMOS transistors; and drains of the PMOS transistors are connected to the second lines, sources are connected to the power voltage, and the main word line signals are applied to gates of the PMOS transistors.

The semiconductor memory device may further comprise: a word line driver which generates the main word line signals in response to a word line enable signal and a block address.

The semiconductor memory device may further comprise: diode transistors connected between the power voltage and the PMOS transistors. The second voltage may be obtained by subtracting a threshold voltage of the diode transistors from the power voltage.

The bias circuits may comprise inverters for biasing the selected second line to the first voltage in response to the main word line signals. The semiconductor memory device may further comprise: a word line driver which generates the main word line signals in response to a word line enable signal and a block address. Each memory cell may comprise: a phase change material connected to one of the first lines; and a diode connected between the phase change material and one of the second lines.

According to another aspect of the present invention, there is provided a method of writing data to a selected memory cell connected to a selected first line and a selected second line of a semiconductor memory device including a plurality of memory cells in which a first terminal of a memory cell is connected to a corresponding first line among a plurality of first lines and a second terminal of a memory cell is connected to a corresponding second line among a plurality of second lines, the method comprising: biasing the selected first line to a predetermined voltage; biasing the selected second line to a first voltage; and basing non-selected second lines to a second voltage.

According to still another aspect of the present invention, there is provided a semiconductor memory device comprising: a plurality of first lines and a plurality of second lines; and a memory cell array including a plurality of memory cells in which a first terminal of a memory cell is connected to a corresponding one of the first lines and a second terminal of the memory cell is connected to a corresponding one of the second lines; wherein a selected second line is biased to a first voltage; and non-selected second lines are biased to a second voltage.

The semiconductor memory device may further comprise: bias circuits which control the voltage of the second lines; wherein the bias circuits comprise: NMOS transistors which bias the selected second line to the first voltage; and PMOS transistors which bias non-selected second lines to the second voltage.

According to yet another aspect of the present invention, there is provided a semiconductor memory device comprising: a memory cell array including a plurality of phase change memory cells in which a first terminal of a phase change memory cell is connected to a corresponding first line among a plurality of first lines and a second terminal of a phase change memory cell is connected to a corresponding second line among a plurality of second lines; and inverters for biasing a selected second line to a first voltage and non-selected second lines to a second voltage in response to main word line signals. Input terminals of the inverters may receive the main word line signals, and output terminals of the inverters are connected to the second lines.

BRIEF DESCRIPTION OF THE DRAWINGS

The above and other features of the present invention will become more apparent by describing in detail exemplary embodiments thereof with reference to the attached drawings in which.

DETAILED DESCRIPTION OF EXEMPLARY EMBODIMENTS

Figure 1:
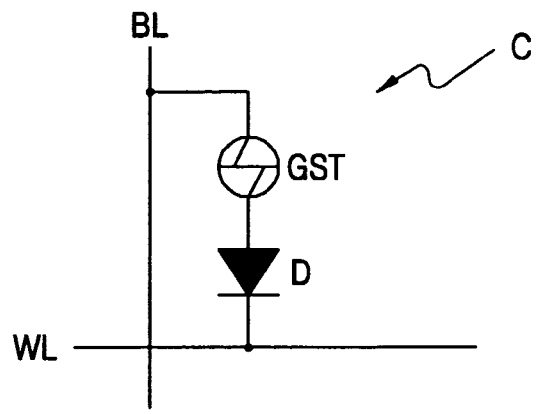
FIG. 1 illustrates an equivalent circuit of a unit cell of a PRAM.
Figure 2:
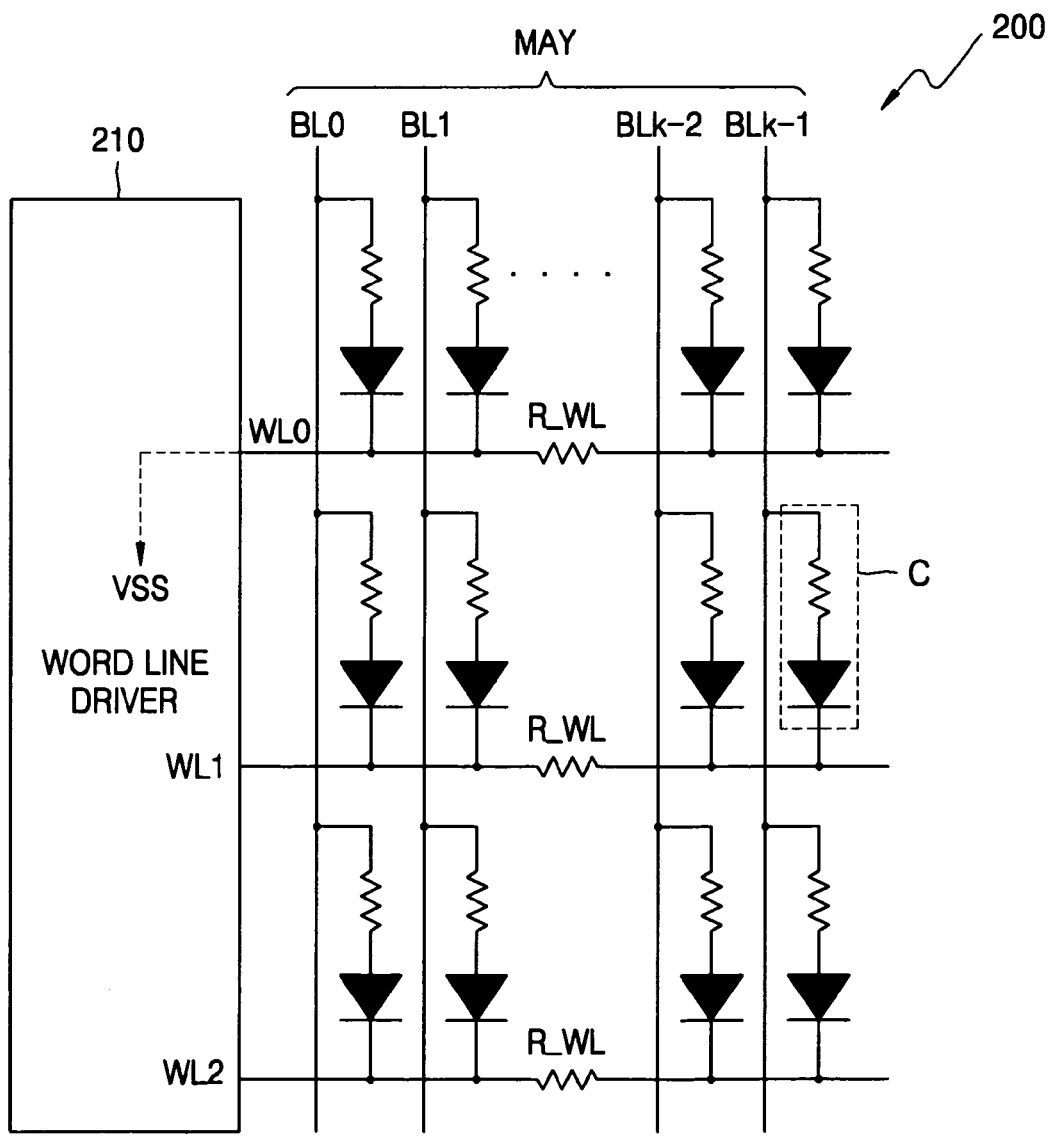
FIG. 2 illustrates a semiconductor memory device comprising a memory cell array including a plurality of the unit cells shown in FIG. 1.

The present invention will now be described more fully with reference to the accompanying drawings, in which exemplary embodiments of the invention are shown. Like reference numerals represent like elements throughout the drawings.

Figure 3:
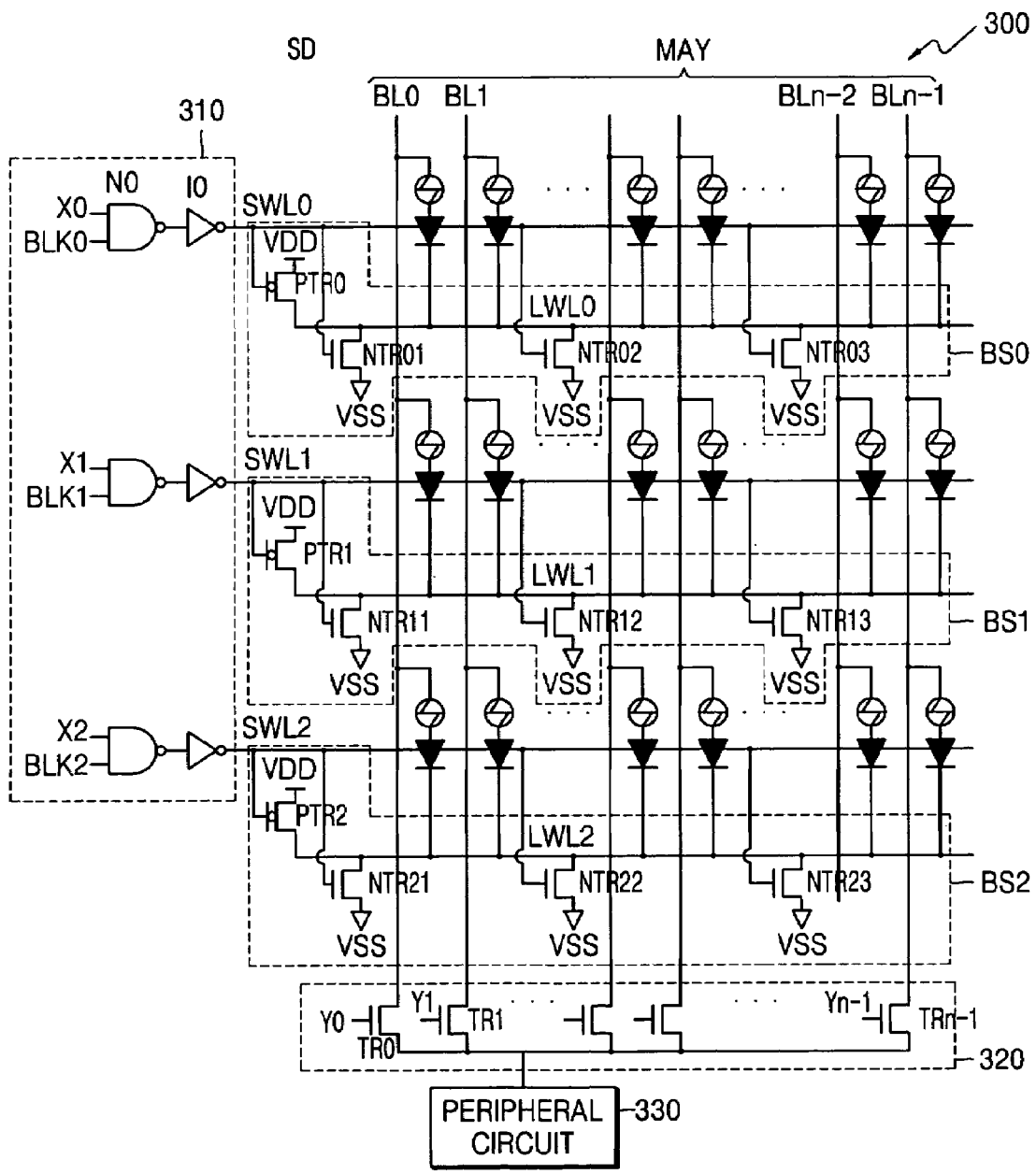
FIG. 3 illustrates a semiconductor memory device according to an exemplary embodiment of the present invention.

FIG. 3 illustrates a semiconductor memory device 300 according to an embodiment of the present invention. Referring to FIG. 3, the semiconductor memory device 300 includes a memory cell array MAY, bias circuits BS0, BS1, and BS2, and a word line driver 310. The semiconductor memory device 300 is a PRAM, which includes a memory cell having a phase change material, e.g., GST, connected to a first line, and a diode connected between the phase change material and a second line. The PRAM may be similar to or the same as that shown in FIG. 1.

As shown in FIG. 3, the semiconductor memory device 300 is connected to a peripheral circuit 330 and a column decoder 320. The peripheral circuit 330 may comprise a write driver (not shown) and a sense amplification circuit (not shown). The column decoder 320 includes transistors TR0, TR1,~TRn-1 which are turned on or off in response to column selection signals Y0~Yn-1.

The memory cell array MAY includes a plurality of memory cells in which a first terminal of a memory cell is connected to a corresponding first line among a plurality of n first lines BL0~BLn-1 where n is a natural number, and a second terminal of the memory cell is connected to a corresponding second line among a plurality of second lines LWL0, LWL1, and LWL2. The plurality of first lines BL0~BLn-1 are bit lines and the plurality of second lines LWL0, LWL1, and LWL2 are word lines.

Even though only three second lines LWL0, LWL1, and LWL2 are shown in FIG. 3, the number of second lines is not limited thereto.

The bias circuits BS0, BS1, and BS2 bias a selected second line to a first voltage and a non-selected second line to a second voltage. The first voltage is a ground voltage and the second voltage is a power voltage VDD. The term "selected" means that the corresponding second line is activated by the word line driver 310 to write data to the memory cell connected to the second line.

The semiconductor memory device 300 maintains the voltage of a selected word line at the ground voltage, and prevents non-selected word lines from floating, thereby preventing a current from flowing from a selected bit line to the non-selected word line. In this way, the semiconductor memory device 300 can perform stable sensing, and increase its operating speed.

As further shown in FIG. 3, the bias circuits BS0, BS1, and BS2 comprise NMOS transistors NTR01~NTR23 connected between each of the second lines LWL0, LWL1, and LWL2 and a ground voltage VSS, and PMOS transistors PTR0, PTR1, PTR2 connected between each of the second lines LWL0, LWL1, and LWL2 and the power voltage VDD.

Even though only three NMOS transistors are connected to each of the second lines LWL0, LWL1, and LWL2, the number of NMOS transistors is not limited thereto. In addition, the number of NMOS transistors can vary according to the number of memory cells connected to the second lines LWL0, LWL1, and LWL2 and the length of the second lines LWL0, LWL1, and LWL2.

The structure and operation of the bias circuits BS0, BS1, and BS2 will now be described in more detail. The drains of the NMOS transistors NTR01~NTR23 are connected to the second lines LWL0, LWL1, and LWL2, and the sources are connected to the ground voltage VSS, and main word line signals SWL0, SWL1, and SWL2 are applied to the gates of the NMOS transistors NTR01~NTR23.

The word line driver 310 generates the main word line signals SWL0, SWL1, and SWL2 in response to word line enable signals X0, X1, and X2 and block addresses BLK0, BLK1, and BLK2. A main word line signal corresponding to a selected second line has a high level, and a main word line signal corresponding to a non-selected second line has a low level.

For example, when a first column selection signal Y0 of the column decoder 320 is activated to turn on a first transistor TR0, a write current is applied to a first bit line BL0. Data is then written to a memory cell connected between the first bit line BL0 and a first word line LWL0 (which may be a local word line).

If the word line enable signal X0 and the first block address BLK0 are input at a high level, a NAND gate N0 and an inverter I0 generate the first main word line signal SWL0 at a high level. The first main word line signal SWL0 is then generated at a high level and the other main word line signals SLW1 and SWL2 are generated at a low level to select the first word line LWL0.

The NMOS transistors NTR01~NTR23 of the first bias circuit BS0 are turned on in response to the high level of the first main word line signal SWL0, and the first word line LWL0 goes to a low level.

The PMOS transistor PTR0 of the first bias circuit BS0 is turned off. The write current applied to the first bit line BL0 flows to ground through a memory cell and the first word line LWL0 so that data is stored in the memory cell.

The PMOS transistors PTR1 and PTR2 of the second and third bias circuits BS1 and BS2 are turned on by the second and third main word line signals SWL1 and SWL2 at a low level, and the voltage of the second and third word lines LWL1 and LWL2 becomes the power voltage VDD.

The write current applied to the first bit line BL0 does not flow to the second and third word lines LWL1 and LWL2 since the second and third word lines LWL1 and LWL2 are at the power voltage VDD. Thus, memory cells other than that connected to the first bit line BL0 and the first word line LWL0 can stably hold data since they are not influenced by the write current of the first bit line BL0.

Figure 4:
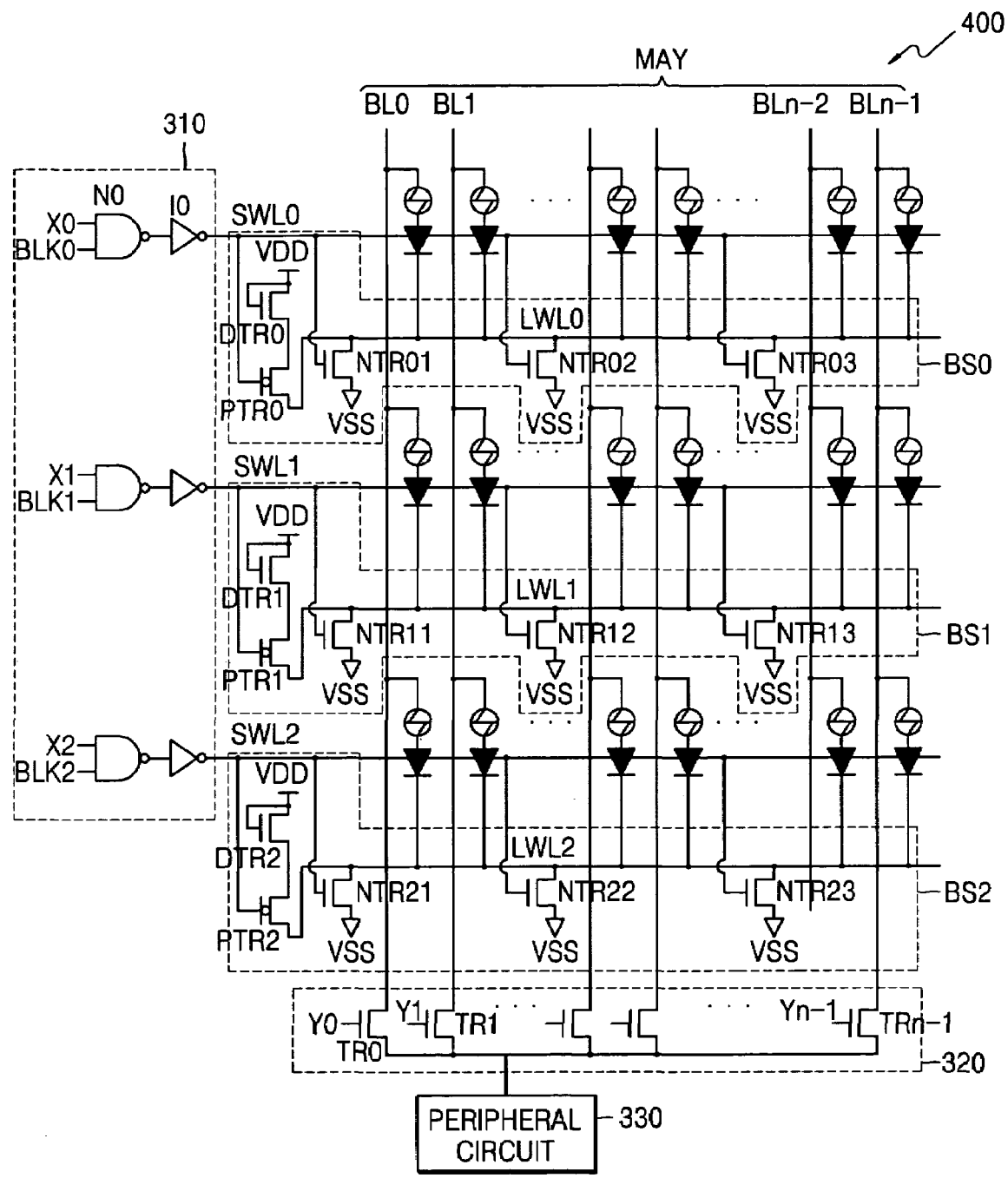
FIG. 4 illustrates another semiconductor memory device according to an exemplary embodiment of the present invention.

FIG. 4 illustrates a semiconductor memory device 400 according to another embodiment of the present invention. The semiconductor memory device 400 has the same or similar structure and operation as the semiconductor memory device 300 shown in FIG. 3. However, the structure of bias circuits BS0, BS1, and BS2 of the semiconductor memory device 400 is different than that of the bias circuits BS0, BS1, and BS2 of the semiconductor memory device 300.

For example, the bias circuits BS0, BS1, and BS2 of the semiconductor memory device 400 include diode transistors DTR0, DTR1, and DTR2 connected between the power voltage VDD and the sources of the PMOS transistors PTR0, PTR1, and PTR2. Word lines (e.g., the second and third word lines LWL1 and LWL2) which are not selected by the diode transistors DTR0, DTR1, and DTR2 are at a voltage obtained by subtracting the threshold voltage of the diode transistors DTR0, DTR1, and DTR2 from the power voltage VDD.

In FIG. 4, the voltage applied to a bit line to create the write current is lower than the power voltage VDD and non-selected word lines maintain a voltage lower than the power voltage VDD.

Figure 5:
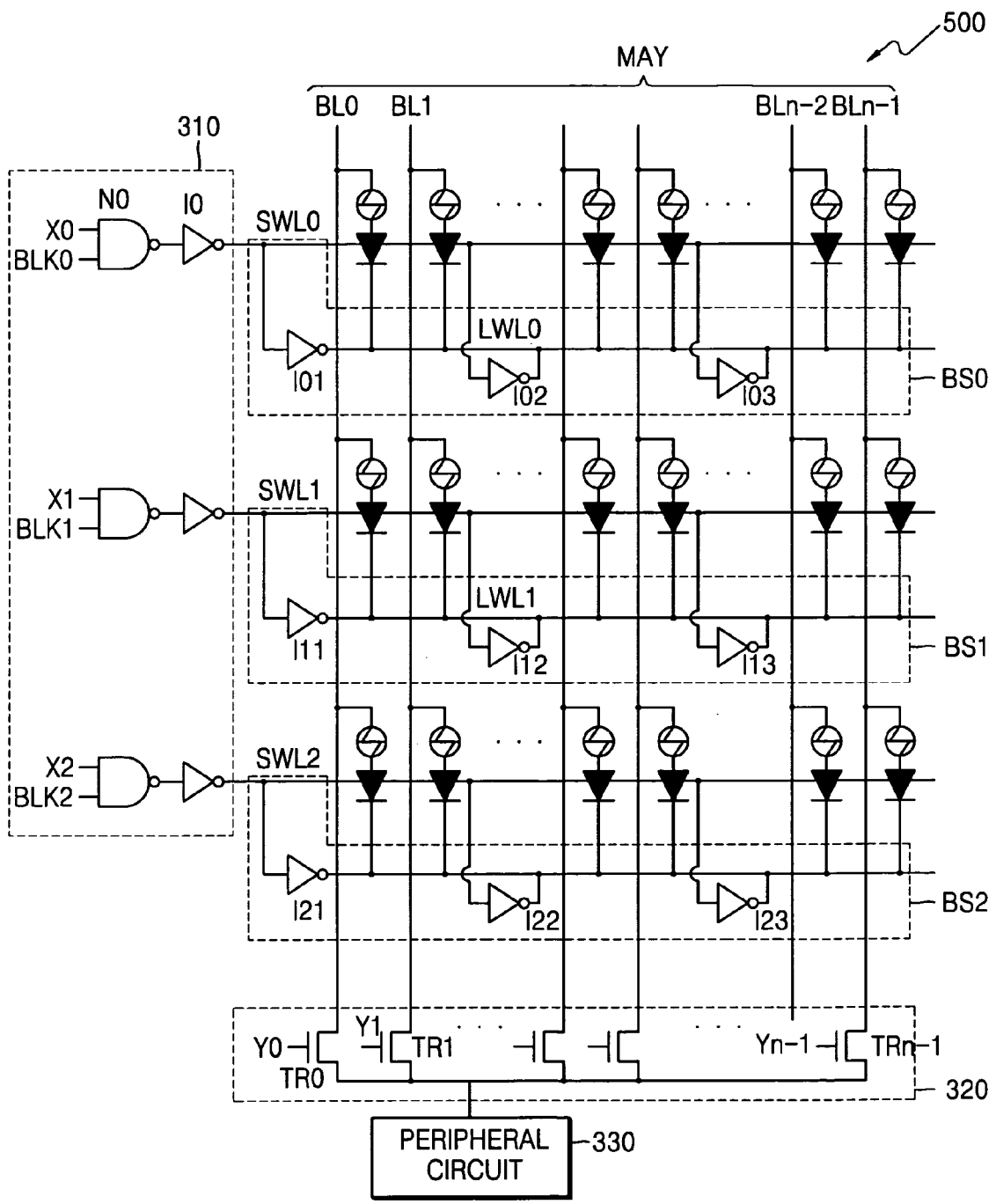
FIG. 5 illustrates still another semiconductor memory device according to an exemplary embodiment of the present invention.

FIG. 5 illustrates still another semiconductor memory device 500 according to an embodiment of the present invention. The semiconductor memory device 500 has the same or similar structure as the semiconductor memory device 300 shown in FIG. 3. However, the structure of bias circuits BS0, BS1, and BS2 of the semiconductor memory device 500 is different than that of the bias circuits BS0, BS1, and BS2 of the semiconductor memory device 300.

As shown in FIG. 4, the bias circuits BS0, BS1, and BS2 of the semiconductor memory device 500 include inverters I01~I23 for biasing a selected second line to a first voltage in response to the main word line signals SWL0, SWL1, and SWL2. The inverters I01~I23 perform the functions of the NMOS transistors NTR01~NTR23 and the PMOS transistors PTR0, PTR1, PTR2 included in the bias circuits BS0, BS1, and BS2 shown in FIG. 3. For example, the main word line signal SWL0 is generated at a high level, and other main word line signals SWL1 and SWL2 are generated at a low level.

The inverters I01, I02, and I03 of the first bias circuit BS0 invert the voltage of the first word line LWL0 to a low level. The inverters I11~I23 of the second and third bias circuits BS1 and BS2 invert the voltage of the second and third word lines LWL2 and LWL3 to a high level. The bias circuits BS0, BS1, and BS2 of the semiconductor memory device 500 perform the same or similar function as the bias circuits BS0, BS1, and BS2 of the semiconductor memory device 300.

A data writing method according to an embodiment of the present invention will now be described. The data writing method may be used by one of the semiconductor memory devices 300, 400 or 500. In addition, the data writing method may be used by a semiconductor memory device other than the semiconductor memory devices 300, 400 or 500 that includes a plurality of memory cells, in which a first terminal of a memory cell is connected to a corresponding first line among a plurality of first lines, and a second terminal connected to a corresponding second line among a plurality of second lines.

In the data writing method, data is written to a selected memory cell connected to a selected first line and a selected second line of a semiconductor memory device. In more detail, the selected first line is biased to a predetermined voltage and the first line is a bit line and the selected first line is a bit line connected to a memory cell for applying data.

A write current for writing data is then applied to a bit line and the selected second line is biased to a first voltage. The selected second line is a word line connected to a memory cell for writing data. The first voltage lowers the voltage of the word line connected to the memory cell for writing data.

Non-selected second lines are biased to a second voltage and the non-selected second lines are word lines other than the word line connected to the memory cell for writing data.

The second voltage lowers the voltage of non-selected second lines other than the word line connected to the memory cell for writing data. In this way, a current is prevented from flowing from a selected bit line to a non-selected word line.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device comprising:
   a memory cell array including a plurality of memory cells in which a first terminal of a memory cell is connected to a corresponding first line of a plurality of first lines and a second terminal of the memory cell is connected to a corresponding second line of a plurality of second lines; and
   a bias circuit for biasing a selected second line of the plurality of second lines to a first fixed voltage and a non-selected second line to a second fixed voltage, wherein the second fixed voltage is obtained by subtracting a predetermined voltage from a power supply voltage, and
   wherein the bias circuit comprises diode transistors and the predetermined voltage is a threshold voltage of the diode transistors.

2. The semiconductor memory device of claim 1, wherein the first fixed voltage is a ground voltage.

3. The semiconductor memory device of claim 2, wherein the bias circuit further comprises:
   NMOS transistors connected between the plurality of second lines and the ground voltage; and
   PMOS transistors connected between the plurality of second lines and the power voltage.

4. The semiconductor memory device of claim 3, wherein drains of the NMOS transistors are connected to the plurality of second lines, sources are connected to the ground voltage, and main word line signals are applied to gates of the NMOS transistors; and
   drains of the PMOS transistors are connected to the plurality of second lines, sources are connected to the power supply voltage, and the main word line signals are applied to gates of the PMOS transistors.

5. The semiconductor memory device of claim 4, further comprising:
   a word line driver which generates the main word line signals in response to a word line enable signal and a block address.

6. The semiconductor memory device of claim 3, wherein the diode transistors are connected between the power supply voltage and the PMOS transistors.

7. The semiconductor memory device of claim 6, wherein the second fixed voltage is obtained by subtracting a threshold voltage of the diode transistors from the power supply voltage.

8. The semiconductor memory device of claim 1, wherein the bias circuit comprises:
   inverters for biasing the selected second line to the first voltage in response to main word line signals.

9. The semiconductor memory device of claim 8, further comprising:
   a word line driver which generates the main word line signals in response to a word line enable signal and a block address.

10. The semiconductor memory device of claim 1, wherein each memory cell comprises:
    a phase change material connected to one of the plurality of first lines; and
    a diode connected between the phase change material and one of the plurality of second lines.

11. The semiconductor memory device of claim 1, wherein the plurality of first lines are bit lines and the plurality of second lines are word lines.

12. A method of writing data to a selected memory cell connected to a selected first line and a selected second line of a semiconductor memory device including a plurality of memory cells in which a first terminal of a memory cell is connected to a corresponding first line of a plurality of first lines and a second terminal of the memory cell is connected to a corresponding second line of a plurality of second lines, the method comprising:
    biasing the selected second line to a first voltage;
    biasing non-selected second lines to a second voltage obtained by subtracting a predetermined voltage from a power supply voltage,
    wherein the predetermined voltage is a threshold voltage of diode transistors used in the step of biasing the non-selected second lines.

13. The method of claim 12, wherein the first voltage is a ground voltage.

14. A semiconductor memory device, comprising:
    a plurality of first lines and a plurality of second lines; and
    a memory cell array including a plurality of memory cells in which a first terminal of a memory cell is connected to a corresponding one of the plurality of first lines and a second terminal of a memory cell is connected to a corresponding one of the plurality of second lines,
    wherein a selected second line is biased to a first fixed voltage,
    non-selected ones of the plurality of second lines are biased to a second fixed voltage,
    wherein the second fixed voltage is obtained by subtracting a predetermined voltage from a power supply voltage, and
    wherein the predetermined voltage is a threshold voltage of diode transistors used in biasing the non-selected second lines.

15. The semiconductor memory device of claim 14, wherein the first fixed voltage is a ground voltage.

16. The semiconductor memory device of claim 14, further comprising:
    bias circuits which control voltages of the second lines;
    wherein the bias circuits comprise:
    NMOS transistors which bias the selected second line to the first fixed voltage; and
    PMOS transistors which bias the non-selected ones of the plurality of second lines to the second fixed voltage.

17. The semiconductor memory device of claim 16, wherein drains of the NMOS transistors are connected to the plurality of second lines, sources are connected to the ground voltage, and main word line signals are applied to gates of the NMOS transistors; and
    drains of the PMOS transistors are connected to the plurality of second lines, sources are connected to the power supply voltage, and the main word line signals are applied to gates of the PMOS transistors.

18. The semiconductor memory device of claim 16, wherein the diode transistors are connected between the power supply voltage and the PMOS transistors.

19. The semiconductor memory device of claim 18, wherein the second fixed voltage is obtained by subtracting the threshold voltage of the diode transistors from the power supply voltage.

20. The semiconductor memory device of claim 16, further comprising:
 a word line driver which generates main word line signals in response to a word line enable signal and a block address.

21. A semiconductor memory device comprising:
 a memory cell array including a plurality of phase change memory cells in which a first terminal of a phase change memory cell is connected to a corresponding first line of a plurality of first lines and a second terminal of a phase change memory cell is connected to a corresponding second line of a plurality of second lines; and
 a plurality of inverters provided for each of the plurality of second lines for biasing a selected second line to a first fixed voltage and non-selected second lines to a second fixed voltage in response to main word line signals.

22. The semiconductor memory device of claim 21, wherein input terminals of the plurality of inverters receive the main word line signals, and output terminals of the inverters are connected to the second lines,
 a main word line signal corresponding to the selected second line is at a high level; and
 main word line signals corresponding to non-selected second lines are at a low level.

23. The semiconductor memory device of claim 22, further comprising:
 a word line driver which generates the main word line signals in response to a word line enable signal and a block address.

* * * * *